United States Patent [19]

Crain et al.

[11] Patent Number: 4,649,539

[45] Date of Patent: Mar. 10, 1987

[54] APPARATUS PROVIDING IMPROVED DIAGNOSABILITY

[75] Inventors: Steven L. Crain, Phoenix; Homer W. Miller, Peoria, both of Ariz.

[73] Assignee: Honeywell Information Systems Inc., Phoenix, Ariz.

[21] Appl. No.: 795,035

[22] Filed: Nov. 4, 1985

[51] Int. Cl.$^4$ .................. G06F 11/00; G11C 11/40; G01R 31/28

[52] U.S. Cl. ......................... 371/25; 307/276; 324/73 R

[58] Field of Search ............ 371/25, 15, 20, 21; 307/276, 455, 443, 454, 559, 485, 466, 467, 272 R, 272 A, 276, 291; 324/73 R, 73 AT; 340/825.68

[56] References Cited

U.S. PATENT DOCUMENTS

| | | | |
|---|---|---|---|
| 4,575,674 | 3/1986 | Bass | 371/25 |
| 4,580,066 | 4/1986 | Berndt | 307/276 |
| 4,580,137 | 4/1986 | Fiedler | 371/25 |
| 4,597,080 | 6/1986 | Thatte | 324/73 R |

OTHER PUBLICATIONS

Hayes, et al., "Synchronization of LSSD System Clocks to Asynchronism Signal", IBM Tech. Disclosure Bulletin, vol. 27, No. 8, 1/85.
Canova, et al., "LSSD Compatible D-Function Latch" IBM Tech. Disclosure Bulletin, vol. 25, No. 10, 3/83.
Goel, "LSSD Test Generation in Presence of Certain Design Rule Violation", vol. 21, No. 1, 6/78.

*Primary Examiner*—Michael R. Fleming
*Attorney, Agent, or Firm*—A. A. Sapelli; J. S. Solakian; A. Medved

[57] ABSTRACT

An apparatus for storing information contained in a selected digital data signal comprises a selector. A first input terminal receives an operational digital data signal when the apparatus is operating in a normal mode, a second input terminal receives a shifted test data signal when the apparatus is operating in a maintenance mode, and a third input terminal is operatively connected to a signal having a constant reset state. The selector operatively connects one of the first, second, and third input terminals to the output terminal of the selector in response to a first and second control signal. A storage element, having a clock input terminal adapted to receive a clock signal and having a reset terminal adapted to receive a reset signal, stores the state present at the selected input terminal of the selector coincident with the clock signal. A switching element couples the second control signal to the reset terminal of the storage element when the apparatus is in the normal mode thereby causing the apparatus to be placed in a rest state immediately upon the occurrence of the second control signal asynchronously to the clock signal, and couples the second control signal to the selector in the maintenance mode thereby causing the third input terminal of the selector to be operatively connected to the output terminal of the selector causing the apparatus to be placed in the reset state coincident with the clock signal, the second control signal having priority over the first control signal in the selection of the input terminals of the selector.

6 Claims, 4 Drawing Figures

APPARATUS PROVIDING IMPROVED DIAGNOSABILITY

BACKGROUND OF THE INVENTION

This invention relates to a storage element within digital equipment or within data processing systems for implementing shift path maintenance techniques, and more particularly, to an improved bistable device, which can be used singularly as an indicator or in combination forming registers and the like, which is included in the maintenance shift path having essentially no restrictions to interfere with the operation of the shift path maintenance techniques.

A method used to test a large group of digital logic elements within digital equipment or data processing systems uses a technique commonly known as shift path maintenance techniques. (Various manufacturers of computer equipment have utilized these techniques which have been given a variety of names such as Scan Path, Native Fault Test, LSSD (level sensitive scan design), . . . (These shift path maintenance techniques will not be discussed further herein since they are well known in the art.) Generally, there are some implementation restrictions in the shift path maintenance technique test environment which include:

1. all of the bistable devices (i.e., devices that store information) must not be allowed to change state until a specific point in time (i.e., clock time), and
2. all the bistable devices must be clocked simultaneously.

The first restriction implies that asynchronous set and reset inputs to a bistable device are not to be used, and the second restriction implies that multiphase clocks are not allowed. If these restrictions are followed then test patterns can be automatically generated. These two restrictions are well known in the industry. Hence, these restrictions limit the use of scan path maintenance techniques in asynchronous systems since such systems widely use multiphase clock and asynchronous inputs to the bistable devices. These restrictions limit the flexibility of the logic system being designed because these restrictions imply that if the shift path maintenance test method is to be used, there must not be any asynchronous setting or resetting of any of the bistables in the design. Furthermore, the clock that clocks one group of bistable devices must also be used to clock the other bistables in the system (i.e., the system must be a single clock system).

Thus, in order to produce scan path maintenance tests automatically, there is a need to provide an apparatus that would allow the restrictions of a shift path maintenance test environment to coexist with a design which uses multiple clocks and many asynchronous signals to change the state of the bistables in the digital equipment or data processing systems.

The present invention provides a device which eliminates the two hardware design constraints mentioned above. The apparatus of the present invention provides for the coexistence of asynchronous state changes of the bistable devices and multiphase functional clocks along with the implementation of the scan path maintenance techniques.

SUMMARY OF THE INVENTION

Therefore, there is provided by the present invention, an apparatus for storing information contained in a selected digital data signal coupled to the apparatus, the digital data signal having at least two states, wherein a first state is defined as a set state and a second state is defined as a reset state. The apparatus comprises a selector having a first, a second, and a third input terminal and an output terminal. The first input terminal receives an operational digital data signal when the apparatus is operating in a normal mode, the second input terminal receives a shifted test data signal when the apparatus is operating in a maintenance mode, and the third input terminal is operatively connected to a signal having a constant reset state, the first and second input terminals being the data input terminals of the apparatus. The selector operatively connects one of the first, second, and third input terminals to the output terminal in response to a first and second control signal. A storage element having a clock input terminal adapted to receive a clock signal and having a reset terminal adapted to receive a reset signal, stores the state present at the selected input terminal of the selector element coincident with the clock signal. A switching element, having an input terminal adapted to receive the second control signal, operatively connected to the reset terminal of the storage element, couples the second control signal to the storage element when the apparatus is in the normal mode thereby causing the apparatus to be placed in the second state immediately upon the occurrence of the second control signal asynchronously to the clock signal. In the maintenance mode, the switching element couples the second control signal to the selector, thereby causing the third input terminal of the selector to be operatively connected to the output terminal of the selector causing the apparatus to be placed in the second state coincident with the clock signal, the second control signal having priority over the first control signal in the selection of the input terminals of the selector.

The purpose of all forms of the Shift Path Maintenance technique is to correct the difficult problem of testing Sequential logic to that of testing Combinitorial logic where the "D" algorithm may be used to automatically generate test vectors. The conversion of the ASYNR signal from an asynchronous action in the normal mode (NFTM-O) to a synchronous action in the test mode (NFTM=1, NFTR=0, NFTS=0) allows asynchronous logic not normally testable to be evaluated by the "D" algorithm.

Accordingly, it is an object of the present invention to provide a device for use in digital equipment which utilizes shift path maintenance techniques.

It is another object of the present invention to provide a device for use in asynchronous digital equipment which utilizes shift path maintenance techniques.

It is still another object of the present invention to provide a device for use in asynchronous digital equipment which utilizes shift path maintenance techniques which overcome restrictions requiring the devices only change state synchronously.

These and other objects of the present invention will become more apparent when taken in conjunction with the following description and attached drawings, wherein like characters indicate like parts, and which drawings form a part of the present application.

BRIEF DESCRIPTION OF THE DRAWINGS

FIG. 3 shows a logic circuit diagram of the one-bit D-type register of the preferred embodiment of the present invention as implemented in CML technology.

DETAILED DESCRIPTION

Figure 1:
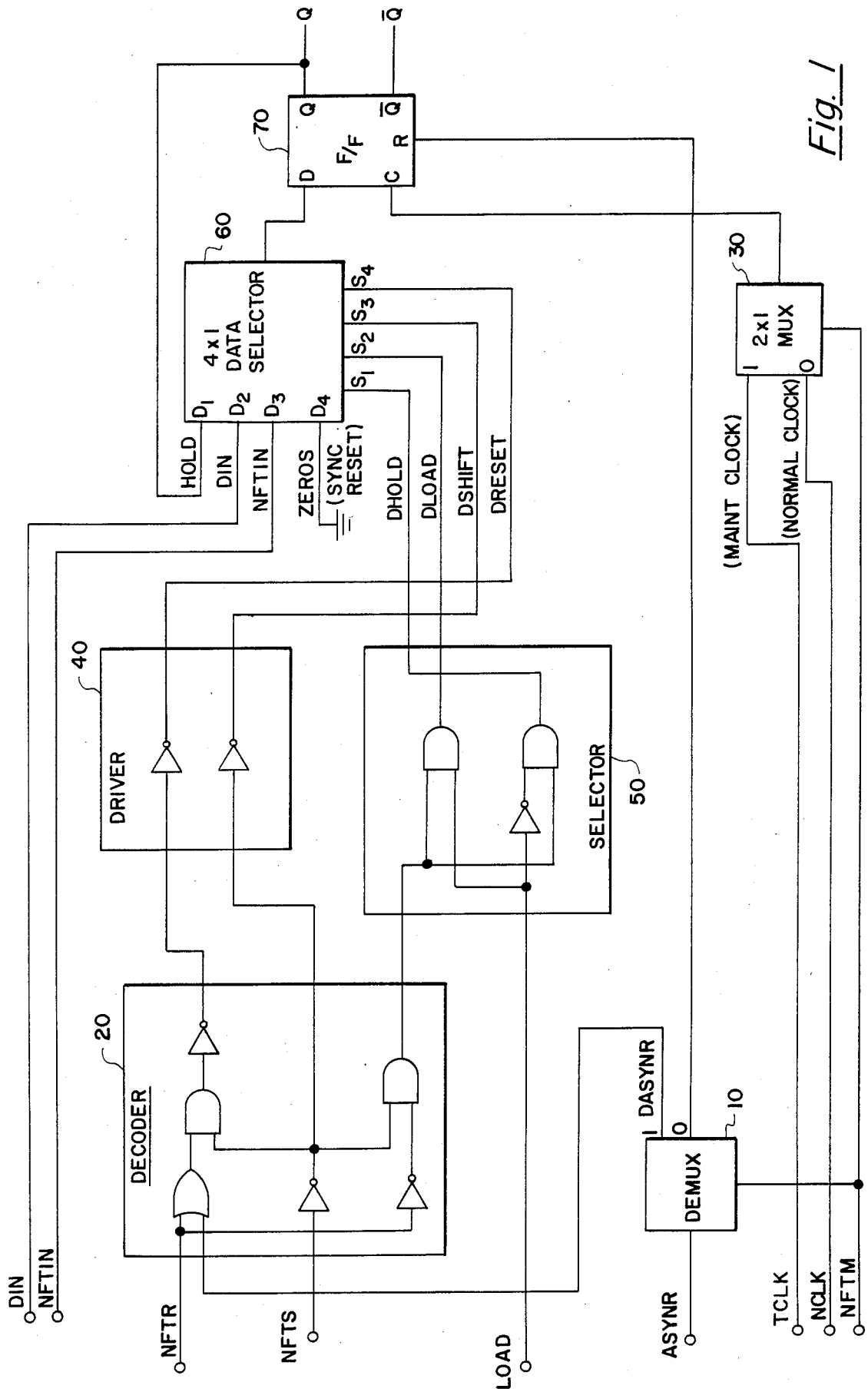
FIG. 1 shows a functional block diagram of a one-bit register of the present invention.

Referring to FIG. 1, there is shown a functional block diagram of a one-bit register of the present invention. The device of the present invention is a bistable device utilized in equipment or data processing systems with some asynchronous attributes which also utilized a shift path maintenance scheme. The device can be clocked by a maintenance (or test) clock, TCLK, or by a functional (or normal) clock, NCLK, in response to a mode control signal (NFTM, native fault test mode). (The functional operation of the device of FIG. 1 will be discussed hereinunder utilizing positive logic, however it will be understood by those skilled in the art that the device may be implemented utilizing negative logic, . . .)

When the mode control signal (NFTM) is a logic zero (i.e., low or inactive), the bistable device of FIG. 1 operates in a normal configuration or mode.

A demux 10 of the device of the present invention, includes an input terminal which is configured to receive an asynchronous reset signal, ASYNR, from a predetermined circuit of the digital equipment (or data processing system). In the normal mode of operation, the demux 10 is configured by the mode control signal, NFTM, such that the asynchronous reset signal is coupled directly to the reset terminal (R) of a D-type flip-flop (F/F) 70.

A 2×1 mux 30 has two input terminals, one for receiving the maintenance clock signal (TCLK) and one for receiving the normal clock signal (NCLK). The output of the 2×1 mux 30 is operatively connected to the clock input (c) of the F/F 70. In the normal mode of operation the 2×1 mux 30 is configured to transfer the normal clock signal to the clock input of F/F 70 in response to the mode control signal NFTM. Thus, in the normal mode of operation, the F/F 70 is clocked by the normal clock signal, NCLK, and can be reset immediately upon the activation of the asynchronous signal, ASYNR, i.e, F/F 70 is reset asynchronously by the ASYNR signal.

A 4×1 data selector 60 having four input terminals and one output terminal is provided, the output terminal of the 4×1 data selector 60 being operatively connected to the data input (D terminal) of F/F 70. One of the four input terminals, $D_1$ through $D_4$, is operatively connected to the output terminal of the 4×1 data selector 60 in response to a select control signal which activates the corresponding select terminals, $S_1$ through $S_4$. When $S_1$ is active, input terminal $D_1$ is operatively connected to the output terminal, when $S_2$ is active input terminal $D_2$ is operatively connected to the output terminal . . . , and when $S_4$ is active input terminal $D_4$ is operatively connected to the output terminal. The first input terminal, $D_1$, of the 4×1 data selector 60, is operatively connected to the Q output of F/F 70, thereby providing a HOLD condition. The second input terminal $D_2$ of the 4×1 data selector 60 is operatively connected to an input terminal, DIN, for receiving a data input signal. The third input terminal, $D_3$ is connected to an input terminal, NFTIN, for receiving a data input signal from a predetermined bistable device forming part of the shift path of the shift path maintenance environment. The fourth input terminal, $D_4$, of the 4×1 data selector 60 is tied to a logic zero thereby providing a 0 input to the D terminal of the F/F 70 when the $D_4$ input terminal is selected. Select control signals DHOLD, DLOAD, DSHIFT, and DRESET, are operatively coupled to the respective select terminals $S_1$ through $S_4$ of the 4×1 data selector 60. The select control signals are generated by the logic of a decoder 20, a driver 40, and a selector 50 in response to input control signals. The input control signals include the reset control signal in the test mode, NFTR, a shift control signal in the test mode, NFTS, and a load control signal, LOAD.

Thus, in the normal mode NFTM is a logic zero, causing the ASYNR terminal to be directly connected to the reset terminal of F/F 70 via DMUX 10, and the normal clock signal, NCLK, is directly coupled to the clock terminal of F/F 70 through 2×1 MUX 30. The select control signals NFTR and NFTS are both a logic zero causing the select control signals DRESET and DSHIFT to be a logic zero. The input control signal LOAD causes the selection of the $D_1$ or $D_2$ input terminal of the 4×1 data selector 60. When LOAD is a logic one, DLOAD is active thereby causing the data in signal DIN to be operatively coupled to the D terminal of F/F 70 via the 4×1 data selector 60. When the input control signal LOAD is a logic zero, or low, the DHOLD signal is active thereby selecting the $D_1$ input terminal of the 4×1 data selector 60 causing the hold condition to be present, i.e., the output of the F/F 70 is coupled to the D terminal of F/F 70. (The logic symbols utilized in the decoder 20, driver 40, and selector 50, are the standard AND, OR, and inverter functions defined by mil-std 806 which is readily recognizable to those skilled in the art.) The operation of the device of FIG. 1 is shown in the truth table of Table 1 and is consistent with the description above. Although various states have been omitted, only the operational states have been shown. It is assumed that the other states will not occur and the design does not include the logic to prohibit these states although such logic, not forming a part of the present invention may be included.

TABLE 1

| ASYN | NFTM | NFTR | NFTS | LOAD | ACTIVE SELECT CONTROL |
|---|---|---|---|---|---|
| 0 | 0 | 0 | 0 | 0 | DHOLD |
| 0 | 0 | 0 | 0 | 1 | DLOAD |
| 1 | 0 | X | X | X | F/F IS UNCONDITIONALLY RESET |

X = Don't Care.

In the test mode, NFTM is a logic one causing the maintenance (or test) clock, TCLK, to be coupled to the clock terminal of F/F 70 and the ASYNR input terminal is operatively connected to the decoder 20. In test mode operation, NFTR and NFTS are initially a logic zero. It is anticipated that the test operation proceeds such that NFTR is set to a logic one resulting in the select control signal DRESET being active selecting the $D_4$ input terminal thereby resetting the F/F 70 coincident with the clock signal, TCLK (synchronous reset). NFTR is then returned to a logic zero, and NFTS is set to a logic one causing select control signal DSHIFT to be active thereby selecting input terminal $D_3$ of 4×1 data selector 60 such that predetermined data at the NFTIN terminal is shifted into F/F 70. NFTS is then returned to a logic zero. The digital equipment or data processing system is then allowed to execute normally (i.e., in a totally synchronous fashion). If the reset signal, ASYNR becomes active during the execution, ASYNR is coupled through the decoder 20 and driver 40 such that DRESET becomes active. (The implementation is such that the DRESET select control signal overrides any of the other select control signals except DSHIFT). However, the reset of the F/F 70 can only occur synchronously with the TCLK signal since the ASYNR signal is effectively coupled to the F/F 70 through the D input of F/F 70, thereby causing the asynchronous reset signal to reset the F/F 70 synchronously with the clock signal. The device of the present invention can then be utilized in asynchronous digital equipment having a shift path maintenance environment. The operation of the device 70 in the test mode is depicted in the truth table of Table 2.

TABLE 2

| ASYNR | NFTM | NFTR | NFTS | LOAD | ACTIVE |
|---|---|---|---|---|---|
| 0 | 1 | 0 | 0 | 0 | DHOLD |
| 0 | 1 | 0 | 0 | 1 | DLOAD |
| 0 | 1 | X | 1 | X | DSHIFT |
| 0 | 1 | 1 | 0 | X | DRESET |
| 1 | 1 | X | 0 | X | DRESET |

X = Don't Care.

Figure 2:
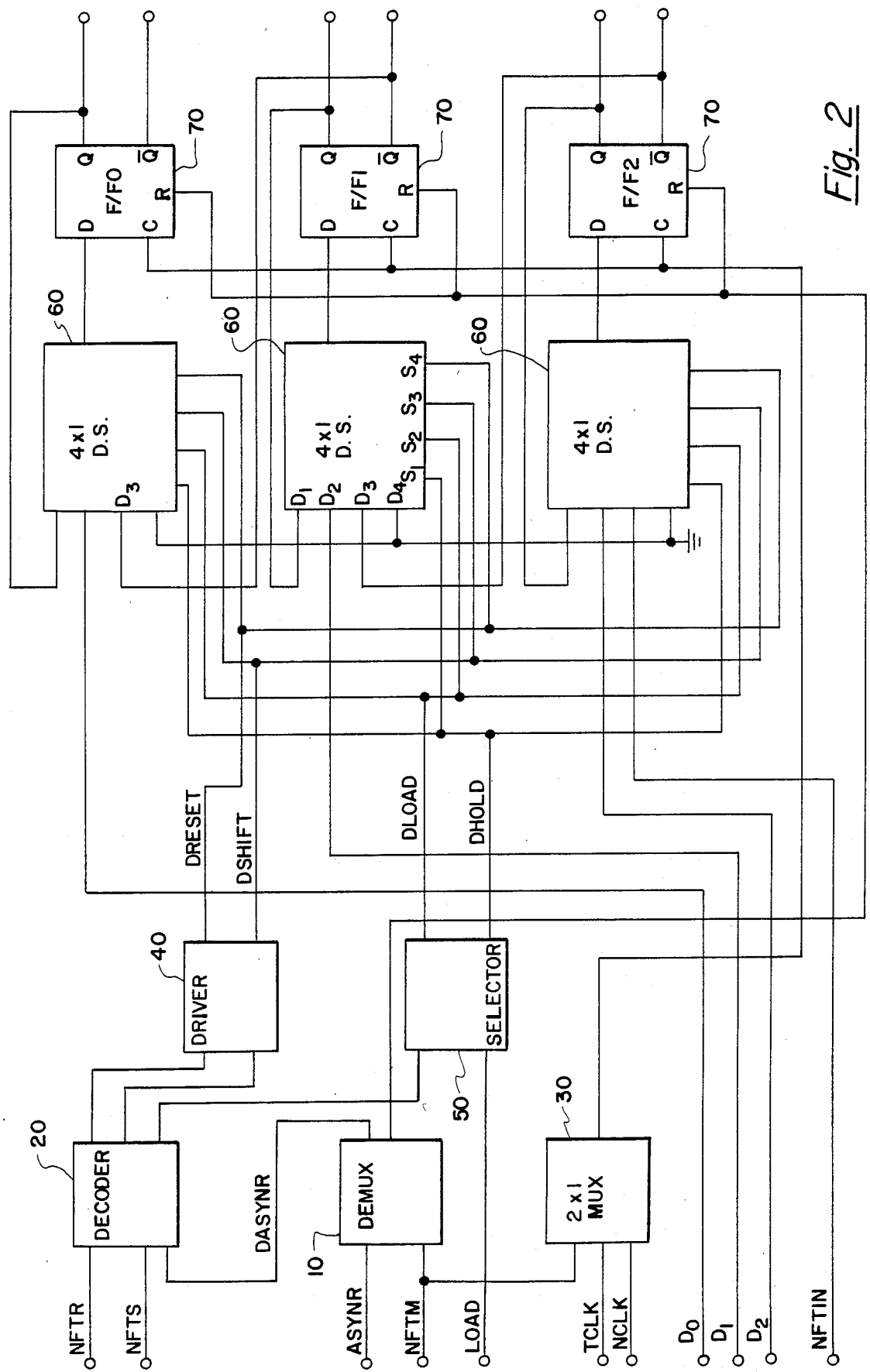
FIG. 2 shows a functional block diagram of the present invention coupling together a plurality of the one-bit registers to form a three-bit register, sharing common control logic.

Referring to FIG. 2 there is shown a functional block diagram of the present invention implemented as a three-bit register. The control elements are utilized to drive a plurality of flip-flops, F/F0, F/F1, and F/F2, and their associated 4×1 data selectors 60. The control elements, comprise the decoder 20, driver 40, DEMUX 10, selector 50, and 2×1 MUX 30. Each data selector 60 has a corresponding data input $D_0$, $D_1$, and $D_2$. The NFTIN input, that is the input of test data in the shift path is operatively connected to the least significant bit position F/F2 of the three-bit register. In the embodiment as shown in FIG. 2 the $\overline{Q}$ output of F/F2 is operatively connected to the $D_3$ input terminal of the 4×1 data selector 60 associated with F/F1, the $D_3$ terminal being the NFTIN input for the F/F1 stage or the shift input for this state. Thus, in the test mode when data is being shifted into the register the output of the flip-flop 2 is coupled to the input of flip-flop 1, an inversion occurring between each bit. Likewise, the Q output of flip-flop 1 is operatively connected to the $D_3$ terminal of the 4×1 data selector 60 associated with flip-flop 0. The output of the three-bit register of FIG. 2 for the shift data in the test mode is the $\overline{Q}$ output of flip-flop 0. It is a matter of design choice to choose the $\overline{Q}$ output of a stage as the input for the next stage, the Q input could have been chosen as well. The operation of the decoder 20, driver 40, DEMUX 10, selector 50, and 2×1 MUX 30 are the same as described above in connection with the one-bit register of FIG. 1. Although FIG. 2 only shows a three-bit register, it will be understood that a five-bit register, eight-bit register, ... n-bit register can be implemented using the concept as described above in connection with the one-bit flip-flop, the size of the register being dictated by the technology utilized, real estate of the I/C available, power requirements, ...

Figure 3A:
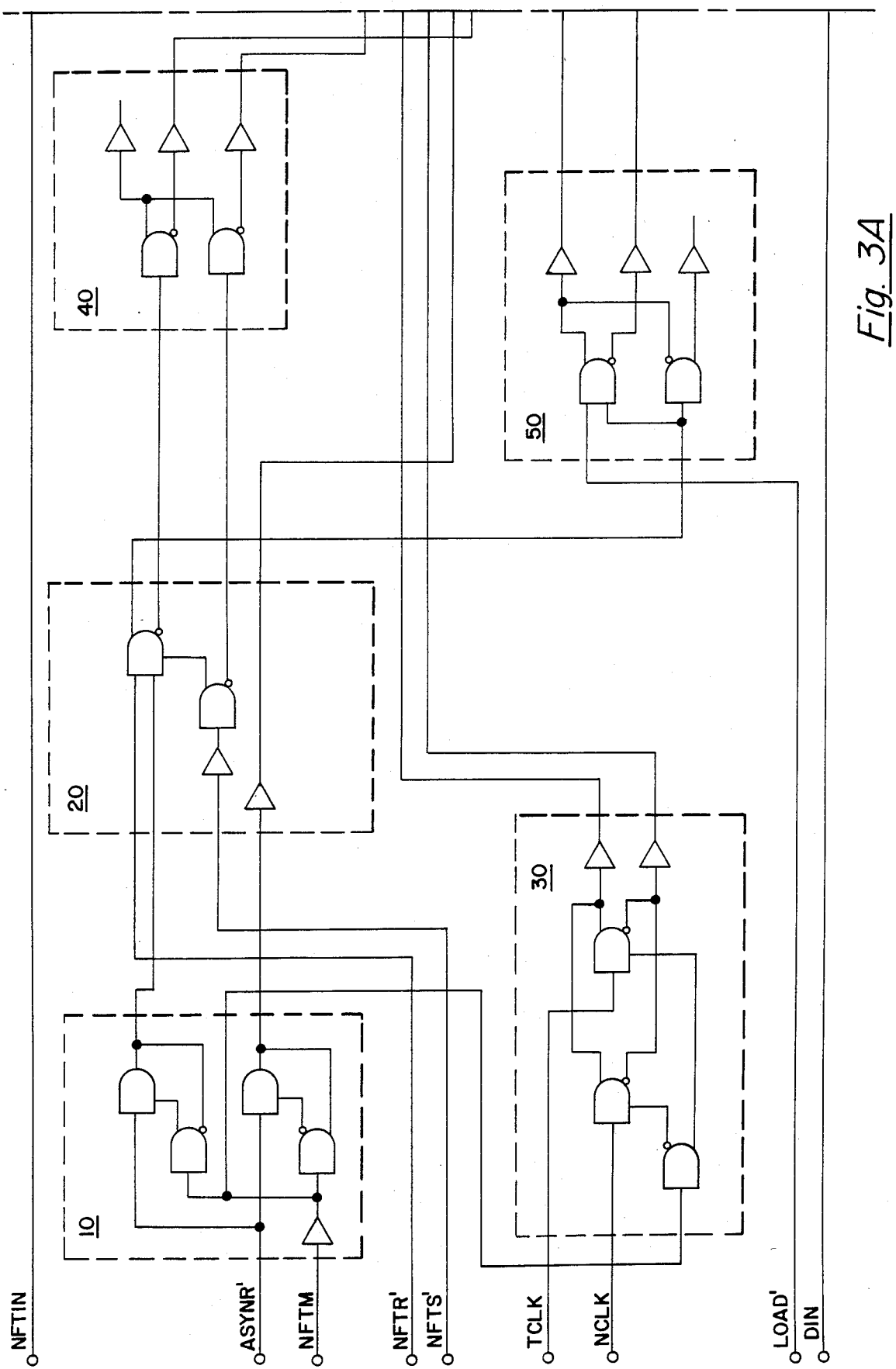
FIGS. 3A and 3B, taken together to form
Figure 3B:
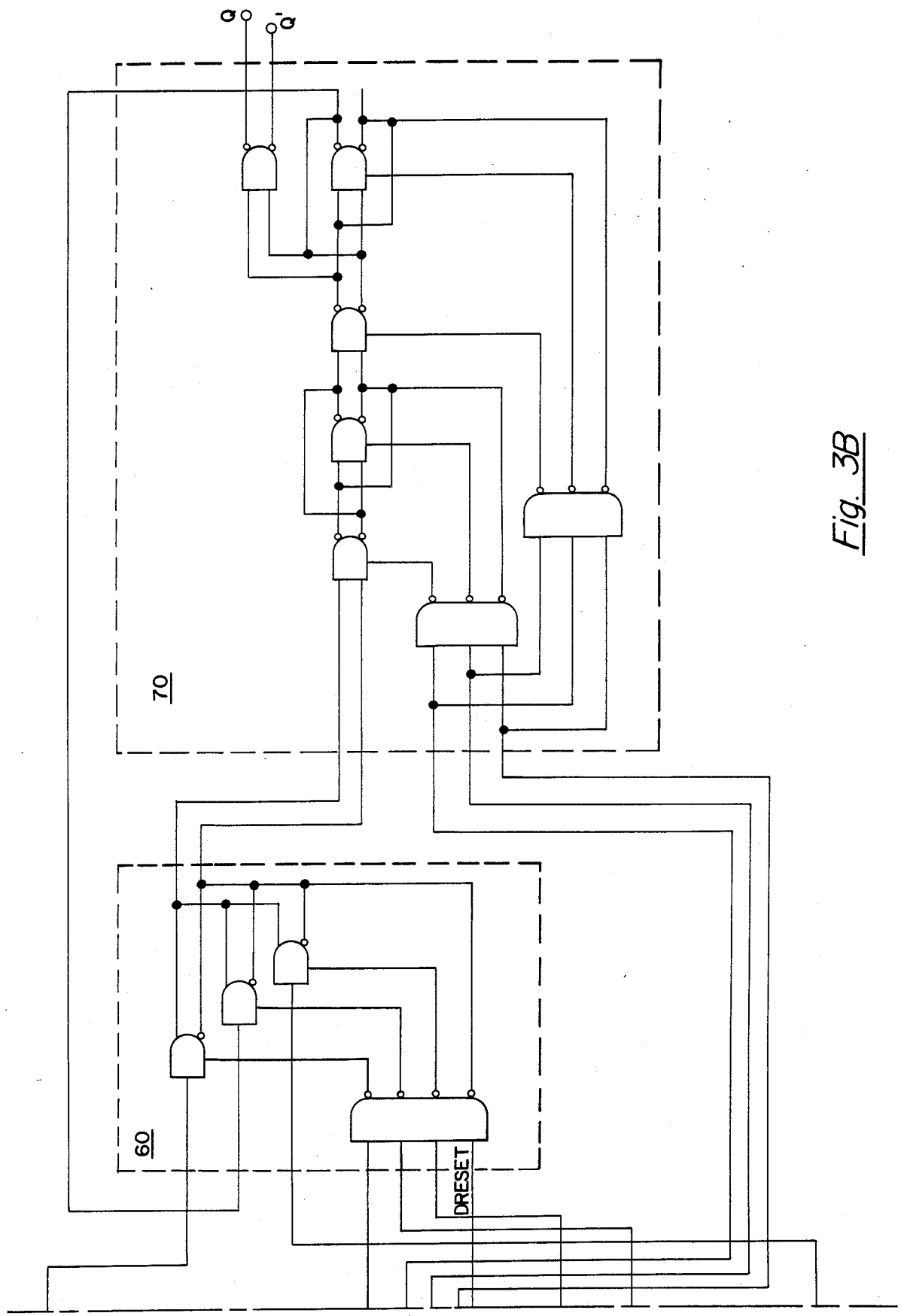

FIGS. 3A and 3B, taken together form FIG. 3, shows a logic circuit diagram of the one-bit D type register utilizing a CML technology. In this implementation it can be more readily seen how the DC reset input ASYNR' overrides all inputs and sets the Q outputs of the flip-flop to a logic zero without a clock input in the normal mode.

Although the specific implementation described herein is addressed to a D-type register device, it will be understood by those skilled in the art that the implementation can be readily applied to other logic devices, including J-K flip flops, counters, transparent latches, shift registers, ...

While there has been shown what is considered the preferred embodiment of the present invention, it will be manifest that many changes and modifications can be made therein without departing from the essential spirit and scope of the invention. It is intended, therefor, in the annexed claims to cover all such changes and modifications which fall within the true scope of the invention.

We claim:

1. An apparatus for storing information contained in a selected digital data signal coupled to said apparatus, said digital data signal having at least two states, wherein a first state is defined as a set state and a second state is defined as a reset state, said apparatus comprising:

(a) selector means, having a first, a second, and a third input terminal and an output terminal, said first input terminal adapted to receive an operational digital data signal when said apparatus is operating in a normal mode, said second input terminal adapted to receive a shifted test data signal when said apparatus is operating in a maintenance mode, and said third input terminal is operatively connected to a signal having a constant reset state, said first and second input terminals being the data input terminals of said apparatus, for operatively connecting one of said first, second, and third input terminals of said output terminal in response to a first and second control signal;

(b) storage means, having an input terminal operatively connected to the output terminal of said selector means, having an output terminal indicative of the state of said storage means and of said apparatus, having a clock input terminal adapted to receive a clock signal and having a reset terminal adapted to receive a reset signal, for storing the state present at the selected input terminal of said selector means coincident with said clock signal; and (c) switching means, having an input terminal adapted to receive said second control signal, said switching means being operatively connected to said reset terminal of said storage means, and further operatively connected to said selector means, for coupling said second control signal to said storage means when said apparatus is in said normal mode thereby causing said apparatus to be placed in said second state immediately upon the occurrence of said second control signal asynchronously to said clock signal, and coupling said second control signal to said selector means in the maintenance mode, thereby causing the third input terminal of said selector means to be operatively connected to said output terminal of said selector means, causing said apparatus to be placed in the second state coincident with said clock signal, said second control signal having priority over the first control signal in the selection of the input terminals of said selector means.

2. An apparatus for storing information, according to claim 1, further comprising:

multiplexer means, having an output terminal operatively connected to the clock input terminal of said storage means, and having a first input terminal adapted to receive a test clock signal and further having a second input terminal adapted to receive a normal clock signal, for coupling said test clock signal to said clock input terminal of said storage means when said apparatus is in the maintenance mode, and for coupling said normal clock signal to said clock input terminal of said storage means when said apparatus is in the normal mode.

3. An apparatus for storing information, according to claim 2, wherein said selector means further includes a fourth input terminal, said fourth input terminal being operatively connected to the output terminal of said storage means, said fourth input terminal being operatively connected to the output terminal of said selector means in response to a third control signal.

4. An apparatus for storing information, according to claim 3, further comprising:

logic means, having a plurality of input terminals adapted to receive input control signals, and one of said input terminals operatively connected to said multiplexer means to receive the test clock signal, said logic means further operatively connected to said selector means, for providing a predetermined one of said input control signals to said selector means thereby selecting a predetermined input terminal of said selector means to be operatively connected to the input terminal of said storage means.

5. An apparatus for storing information contained in a selected digital data signal coupled to said apparatus, said digital data signal having at least two states, wherein a first state is defined as a set state and a second state is defined as a reset state, said apparatus comprising:

(a) selector means, having a plurality of input terminals including a first, a second, and a third input terminal and at least one output terminal, said first input terminal adapted to receive an operational digital data signal when said apparatus is operating in a normal mode, said second input terminal adapted to receive a shifted test data signal when said apparatus is operating in a maintenance mode, and said third input terminal is operatively connected to a signal having a constant reset state, said first and second input terminals being the data input terminals of said apparatus, for operatively connecting one of said plurality of input terminals to said output terminal in response to one of a plurality of control signals;

(b) storage means, having an input terminal operatively connected to at least one of the output terminals of said selector means, having at least one output terminal indicative of the state of said storage means and of said apparatus, having a clock input terminal adapted to receive a clock signal and having a reset terminal adapted to receive a reset signal, for storing the state present at the selected input terminal of said selector means coincident with said clock signal; and (c) switching means, having an input terminal adapted to receive a reset control signal, said switching means being operatively connected to said reset terminal of said storage means, and further operatively connected to said selector means, for coupling said reset control signal to said storage means when said apparatus is in said normal mode thereby causing said apparatus to be placed in said second state immediately upon the occurrence of said reset control signal asynchronously to said clock signal, and coupling said reset control signal to said selector means in the maintenance mode, thereby causing one of said input terminals of said selector means to be operatively connected to said output terminal of said selector means, causing said apparatus to be placed in the second state coincident with said clock signal, said reset control signal having priority over the plurality of control signals in the selection of the input terminals of said selector means.

6. An apparatus for storing information contained in a selected digital data signal coupled to said apparatus, said digital data signal having at least two states, wherein a first state is defined as a set state and a second state is defined as a reset state, said apparatus comprising:

(a) a plurality of selector means, each selector means having a first, a second, and a third input terminal and an output terminal, said first input terminal adapted to receive an operational digital data signal when said apparatus is operating in a normal mode, said second input terminal adapted to receive a shifted test data signal when said apparatus is operating in a maintenance mode, and said third input terminal is operatively connected to a signal having a constant reset state, for operatively connecting one of said first, second, and third input terminals to said output terminal in response to a first and second control signal;

(b) a plurality of storage means, each storage means having an input terminal operatively connected to the output terminal of a corresponding selector means, and each storage means having an output terminal indicative of the state of said storage means, each storage means having a clock input terminal adapted to receive a clock signal and each storage means having a reset terminal adapted to receive a reset signal, for storing the state present at the selected input terminal of each of said selector means coincident with said clock signal, said shifted test data signal being coupled from the output of one storage means to the second input terminal of the next adjacent selector means; and (c) switching means, having an input terminal adapted to receive said second control signal, said switching means being operatively connected to each reset terminal of each storage means, and further operatively connected to each selector means, for coupling said second control signal to each storage means when said apparatus is in said normal mode thereby causing each storage means of said apparatus to be placed in said second state immediately upon the occurrence of said second control signal asynchronously to said clock signal, and coupling said second control signal to each selector means in the maintenance mode, thereby causing the third input terminal of said selector means to be operatively connected to the corresponding output terminal of said selector means, causing each storage means of said apparatus to be placed in the second state coincident with said clock signal, said second control signal having priority over the first control signal in the selection of the input terminals of each selector means.

* * * * *